(12) United States Patent
Wood et al.

(10) Patent No.: US 6,501,166 B2
(45) Date of Patent: Dec. 31, 2002

(54) STITCHED PLANE STRUCTURE AND PROCESS FOR PACKAGE POWER DELIVERY AND DUAL REFERENCED STRIPLINE I/O PERFORMANCE

(75) Inventors: Dustin Wood, Chandler, AZ (US); Seng Hooi Ong, Simpang Ampat (ML); Edward A. Burton, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/751,542

(22) Filed: Dec. 29, 2000

(65) Prior Publication Data

US 2002/0117744 A1 Aug. 29, 2002

(51) Int. Cl.⁷ ............................................... H01L 23/52

(52) U.S. Cl. ...................................... 257/691; 257/664

(58) Field of Search ................................ 257/691, 664, 257/698

(56) References Cited

U.S. PATENT DOCUMENTS

| | | | |
|---|---|---|---|
| 5,033,970 A | | 7/1991 | Buchoff |
| 5,413,964 A | | 5/1995 | Massingill et al. |
| 5,625,225 A | * | 4/1997 | Huang et al. |
| 5,656,547 A | | 8/1997 | Richards et al. |
| 5,789,807 A | * | 8/1998 | Correale, Jr. |
| 5,956,575 A | | 9/1999 | Bertin et al. |
| 6,008,534 A | * | 12/1999 | Fulcher |
| 6,054,758 A | * | 4/2000 | Lamson |
| 6,075,285 A | * | 6/2000 | Taylor et al. |
| 6,087,199 A | | 7/2000 | Pogge et al. |
| 6,145,438 A | | 11/2000 | Berglund et al. |
| 6,326,235 B1 | | 12/2001 | Glenn |

\* cited by examiner

Primary Examiner—Sheila V. Clark
(74) Attorney, Agent, or Firm—Blakely, Sokoloff, Taylor & Zafman LLP

(57) ABSTRACT

Conductive planes in a power delivery region of a microelectronic package substrate are stitched to correlated conductive planes in a signal region of the substrate. The conductive planes occupy varying horizontal levels of the substrate and are stitched together at a junction between the power delivery region and the signal region of the substrate using alternating tabs connected with vias.

18 Claims, 6 Drawing Sheets

I/O REGION

VSS ——————————————————— 110

———— 120

VCC ——————————————————— 130

VSS ——————————————————— 140

| | Loop inductance in Power Delivery Region (pH/Square) | Loop inductance in I/O Region (pH/Square) | Lateral inductance Across the Junction (pH/Square) |
|---|---|---|---|
| Without Splitting | 20.2 | 40.4 | 20.2 |
| Splitting & Stitching | 13.5 | 40.4 | 21.5 |
| % Difference | -33% | 0% | +6% |

FIG. 7

STITCHED PLANE STRUCTURE AND PROCESS FOR PACKAGE POWER DELIVERY AND DUAL REFERENCED STRIPLINE I/O PERFORMANCE

FIELD OF THE INVENTION

The present invention relates generally to microelectronic packages and, more particularly, to a structure and process that stitches together correlated power planes in a microelectronic package.

BACKGROUND OF THE INVENTION

A modern microelectronic package typically includes a microelectronic die (i.e., a silicon chip) mounted to a substrate with an epoxy-based material. The substrate can be metal, a laminated epoxy glass, or a ceramic plate, and is usually comprised of multiple conductive layers (e.g., power, ground, and signal planes). The microelectronic die may be mounted to the substrate in a variety of ways. In the commonly used flip-chip device, for example, the microelectronic die is mounted face-down to a wiring substrate so that conductive terminals in the microelectronic die (usually in the form of solder balls) are directly physically and electrically connected to a wiring pattern on the substrate.

As microprocessor speeds continue to increase, the assembly of the microelectronic package is having an increasingly greater impact on both the power delivery performance and the I/O (i.e., signal) performance of the system. For example, as clock speeds increase to several hundred megahertz or higher, conventional packaging technology may no longer be satisfactory to accommodate signal transmission requirements.

One method for improving I/O performance has been to utilize a dual referenced stripline stackup. This stackup consists of a metal trace sandwiched between two reference planes which are set at the power rails and have opposite polarities (e.g., a Vcc power plane and a Vss ground plane). The advantage of this stackup is that it ensures return path integrity from the microelectronic die to the motherboard across both rails. However, because power delivery performance in high-speed devices is primarily governed by the amount of noise on the power and ground rails, there has been a demand for improved circuit design and packaging techniques where the signal redistribution processes can be more rapidly and reliably carried out with less electrical noise.

BRIEF DESCRIPTION OF THE DRAWINGS

The present invention is illustrated by way of example, and not limitation, in the figures of the accompanying drawings in which like numerals refer to similar elements and which:

FIG. 7 is a table of stitched plane modeling results in a microelectronic package according to one embodiment of the present invention.

DETAILED DESCRIPTION

Throughout the following description specific details are set forth in order to provide a more thorough understanding of the invention. However, the invention may be practiced without these particulars. In other instances, well known elements have not been shown or described in detail to avoid unnecessarily obscuring the present invention. Accordingly, the specification and drawings are to be regarded in an illustrative rather than a restrictive sense.

As microelectronic packages become faster and smaller, attention is focusing on packaging these devices in such a way as to maximize electrical performance. One approach has been to utilize a dual referenced stripline stackup in the I/O (i.e., signal) region of a substrate. In such a stackup, a metal trace is sandwiched between a power plane (Vcc) and ground plane (Vss). In this example a Vcc power plane is used, but other types of power planes (such as a Vdd power plane) may be used as well. This stackup ensures return path integrity from the microelectronic die to the motherboard.

The optimal stackup in the power delivery region should be designed to maximize mutual coupling. As is well known in the art of microelectronics, noise is a function of microelectronic package inductance. Loop inductance is a function of both the self-inductance and the mutual inductance of the microelectronic package power planes. Microelectronic package loop inductance can be lowered by increasing the mutual inductance between the power and ground planes. In the past, power delivery stackups attempted to achieve this but were limited by the I/O stackup requirements. This satisfied the dual referencing requirement for trace routing, but didn't provide maximum mutual coupling in the power delivery region. It would be helpful if a microelectronic package achieved maximum mutual coupling in the power delivery region and signal path integrity in the I/O region.

Figures 1, 2:
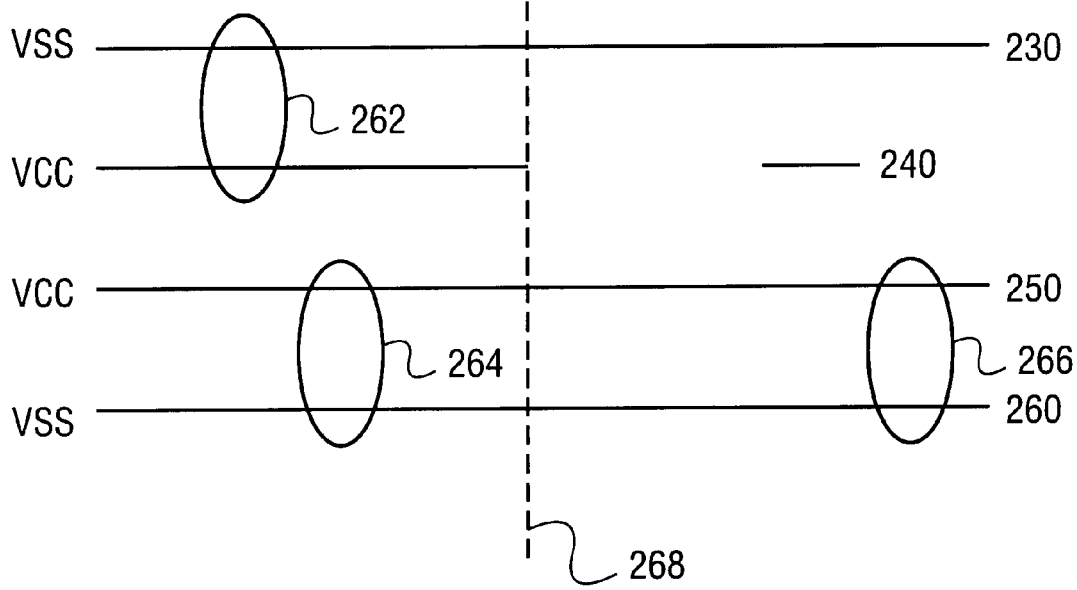
FIG. 1 is a schematic diagram of a dual referenced stripline stackup in an I/O region of a microelectronic package.
FIG. 2 is a schematic diagram of a power delivery region stackup restricted by a dual referenced stripline stackup in an I/O region of a microelectronic package.

Referring now to FIG. 1 there is shown a schematic diagram of a dual referenced stripline stackup in an I/O region of a microelectronic package. The stripline stackup is part of a microelectronic package which includes a substrate for mounting a microelectronic die (not shown in this view). The substrate may be fabricated of laminates such as FR-4, fiberglass or bismaleimide-triazine (BT) material, of coated aluminum, or of alumina, ceramic, or any other suitable material. The microelectronic die may be electrically connected to the substrate using flip chip or C4 attachment ("Controlled Collapse Chip Connection"), Chip-on-Flex ("COF") packaging, or any other one of a variety of mounting technologies well known in the art of microelectronic fabrication.

The substrate itself is formed of multiple conductive layers. In the I/O region of the substrate, stripline transmission lines (i.e., the stripline stackup 100) are formed. Stripline transmission lines comprise a signal trace or multiple signal traces laterally spaced from one another and sandwiched vertically between two electrically conductive planes. Stripline transmission lines are highly desirable in high frequency applications because their impedances are predictable and controllable. In the embodiment illustrated by FIG. 1, the stripline stackup 100 consists of a metal trace 120 sandwiched between two reference planes (i.e., a ground plane (Vss) 110 and a power plane (Vcc) 130) which are set at power rails and have opposite polarities. The Vss plane 110 is the top layer of the substrate and the other layers (i.e., the metal trace 120, the Vcc plane 130, and a Vss plane 140) correspond to the next layers down. It should be appreciated, however, that the Vss plane 110 could be any layer in the substrate, so long as the Vss plane 110 is part of a stripline stackup 100. The advantage of this stripline stackup 100 is that it ensures return path integrity from the microelectronic die to a motherboard (not shown in this view) on which the substrate is mounted.

Referring now to FIG. 2 there is shown a schematic diagram of a power delivery region stackup restricted by a dual referenced stripline stackup in an I/O region of a microelectronic package. As is well known in the art, power delivery performance is primarily governed by the amount of noise on the power and ground rails. This noise is a function of the microelectronic package inductance as illustrated in Equation 1:

$$V = L\frac{di}{dt}$$

(where V is the change in voltage (noise), L is the microelectronic package loop inductance from the microelectronic die to the power source (e.g., VRM, capacitors, etc.), and di/dt is the current transient caused by loading on the microelectronic die). Also, loop inductance is a function of both the self-inductance and the mutual inductance of the microelectronic package power planes which is indicated in Equation 2:

$$\text{Loop}L = 2 \cdot L_{self} - 2 \cdot L_{mutual}$$

(where LoopL is the microelectronic package loop inductance, $L_{self}$ is the self-inductance of the microelectronic package power planes, and $L_{mutual}$ is the mutual inductance between the microelectronic package power planes). According to Equation 1, the noise on the power planes is directly proportional to the microelectronic package loop inductance, and therefore by lowering this loop inductance the noise can be reduced as well. In addition, according to Equation 2, the microelectronic package loop inductance can be lowered by increasing the mutual inductance between the power and ground planes. Therefore, the stackup in the power delivery region of the substrate should be designed to maximize this mutual coupling.

FIG. 2 illustrates the most probable stackup that would be used in the power delivery region 210 of the substrate to account for a dual referenced stripline stackup in the I/O region 220 of the substrate. The Vss plane 230 is the top layer of the substrate and the other layers (i.e., a Vcc/metal trace plane 240, a Vcc plane 250, and a Vss plane 260) correspond to the next layers down. Circles 262, 264, and 266 denote areas where mutual inductive coupling occurs. Junction 268 indicates the point at which the power delivery region 210 merges with the I/O region 220 of the substrate. Although this stackup satisfies the dual referencing requirement for trace routing in the I/O region 220 of the substrate, it doesn't provide maximum mutual coupling in the power delivery region 210 and therefore is not the optimal solution for power delivery.

Figure 3:
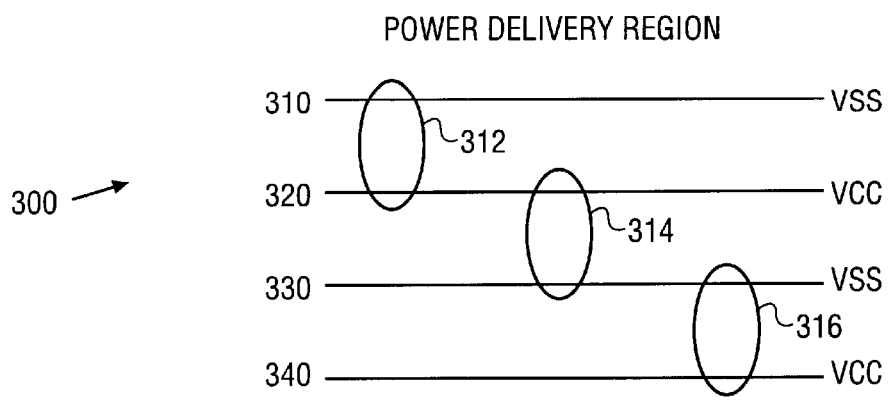
FIG. 3 is a schematic diagram of a power delivery region stackup which maximizes mutual inductive coupling in a microelectronic package.

FIG. 3 is a schematic diagram of a power delivery region stackup 300 which maximizes mutual inductive coupling in a microelectronic package. Maximum mutual inductive coupling as designated by circles 312, 314, and 316 occurs when the Vss planes 310 and 330 and Vcc planes 320 and 340 are alternated throughout the substrate (not shown in this view). The stackup as illustrated in FIG. 3 is the optimal stackup for the power delivery region.

Figure 4:
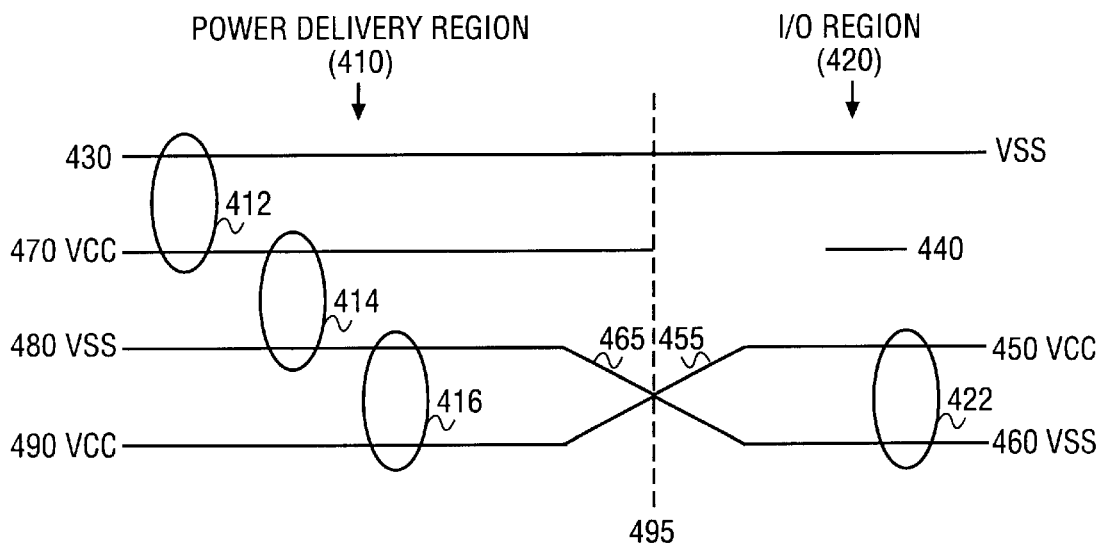
FIG. 4 is a schematic diagram of an optimized power delivery and I/O region stackup utilizing stitched planes in a microelectronic package according to one embodiment of the present invention.

Referring now to FIG. 4 there is shown a schematic diagram of an optimized power delivery and I/O region stackup utilizing stitched planes in a microelectronic package according to one embodiment of the present invention. As previously described, the ideal I/O region 420 stackup (i.e., a Vss plane 430 at the top layer followed by a metal trace 440, a Vcc plane 450, and a Vss plane 460) ensures return path integrity from a microelectronic die to a motherboard (not shown in this view). The ideal power delivery region 410 stackup (i.e., Vss planes 430 and 480 and Vcc planes 470 and 490 alternated throughout the substrate) maximizes mutual inductive coupling as designated by circles 412, 414, 416, and 422. Vss plane 480 in the power delivery region 410 and Vss plane 460 in the I/O region 420 are connected by stitching a via 465 between the two planes. Vcc plane 490 in the power delivery region 410 and Vcc plane 450 in the I/O region 420 are similarly connected by a via 455 stitched between the two planes. By stitching together correlated conductive planes, the current is allowed to flow both perpendicular and parallel to the edge of the substrate. The current path across the junction 495 is thus maintained.

Figure 5:
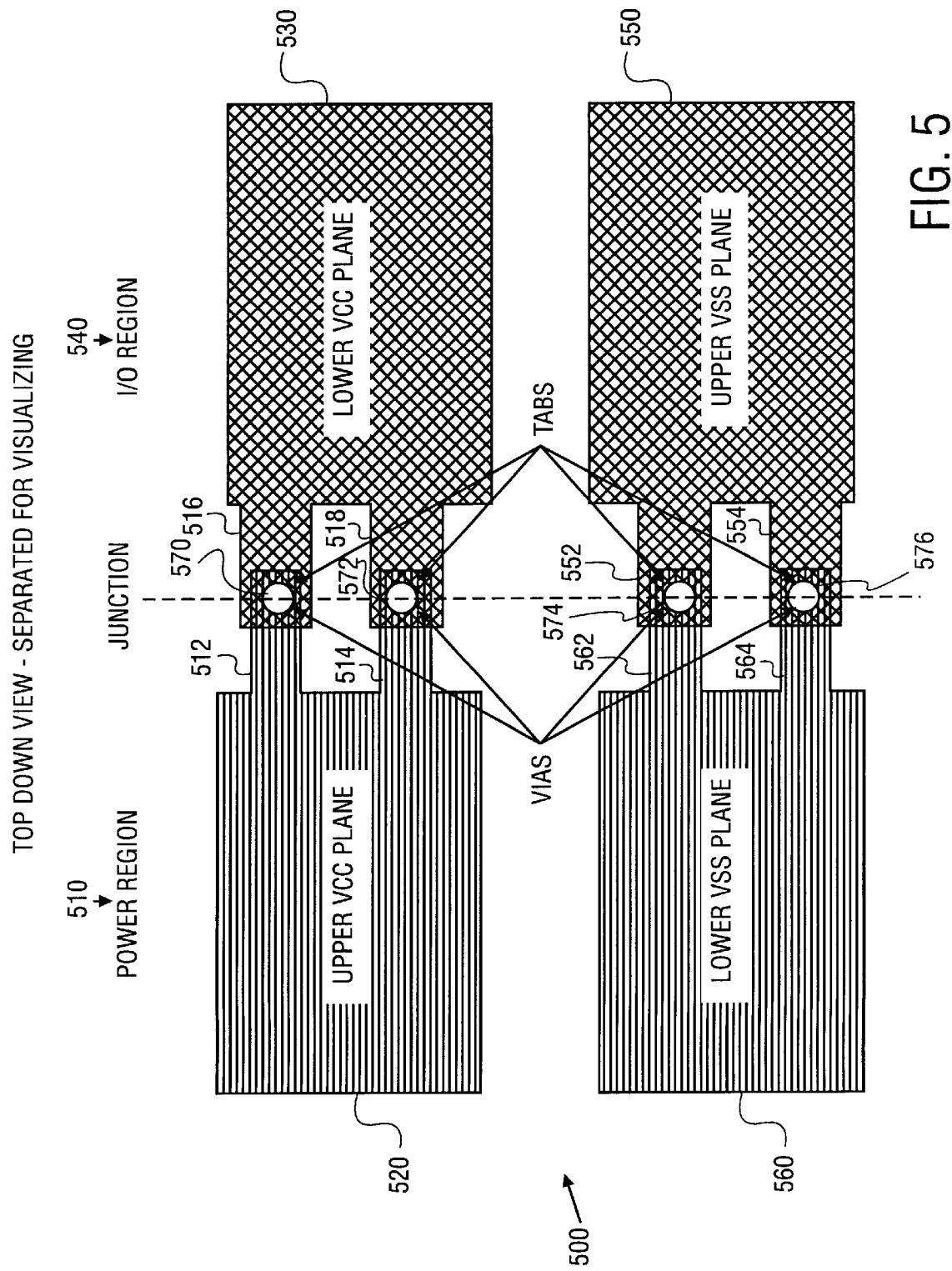
FIG. 5 is a top down view of stitching details across a junction between a power delivery region and an I/O region of a substrate in a microelectronic package according to one embodiment of the present invention.

Referring now to FIG. 5 there is shown a top down view of stitching details across a junction between a power delivery region and an I/O region of a substrate in a microelectronic package according to one embodiment of the present invention. In the view illustrated by FIG. 5, the conductive planes are separated for visualizing (i.e., an upper Vss plane 550 in the I/O region 540 is not shown covering a lower Vcc plane 530 in the I/O region 540 and an upper Vcc plane 520 in the power delivery region 510 is not shown covering a lower Vss plane 560 in the power delivery region 510). Metal fingers (i.e., metal tabs) 512 and 514 in the upper Vcc plane 520 in the power delivery region 510 are vertically connected to similar metal tabs 516 and 518 in the lower Vcc plane 530 in the I/O region 540 of the substrate. Similarly, alternating metal tabs 552 and 554 in the upper Vss plane 550 in the I/O region 540 of the substrate are vertically connected to similar metal tabs 562 and 564 in the lower Vss plane 560 in the power delivery region 510 of the substrate. The stitching consists of alternating vias 570 and 572 connecting the metal tabs 512 and 514 in the upper Vcc plane 520 to the metal tabs 516 and 518 in the lower Vcc plane 530 and alternating vias 574 and 576 connecting the metal tabs 552 and 554 in the upper Vss plane 550 to the metal tabs 562 and 564 in the lower Vss plane 560. In this manner, the current flow throughout the entire microelectronic package is maintained.

Figure 6:
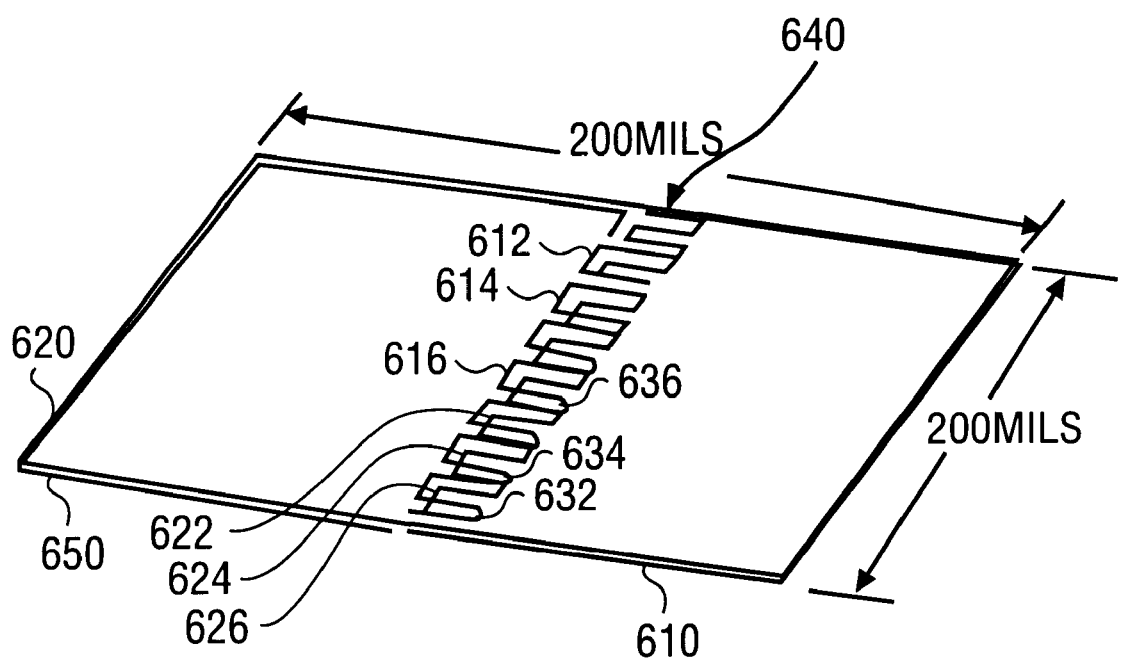
FIG. 6 is a 3-D model of the stitching details shown in FIG. 5.

Referring now to FIG. 6 there is shown a 3-D model of the stitching details shown in FIG. 5. Metal tabs 612, 614, 616, etc., in an upper Vss plane 610 of a substrate (not shown in this view) are stitched together with metal tabs 622, 624, 626, etc., in a lower Vss plane 650 of the substrate using vias 632, 634, 636, etc. Similarly, metal tabs (not shown in this view) in an upper Vcc plane 620 are stitched together with metal tabs in a lower Vcc plane (not shown in this view). The metal tabs 612, 614, 616, etc., are referred to as stitched together because, as is apparent in the embodiment illustrated by FIG. 6, they are essentially interwoven (with tabs fitting in between other tabs at the junction 640) and secured together using vias 632, 634, 636, etc.

The results of the stitching described above are illustrated in FIG. 7, which shows a table of stitched plane modeling results in a microelectronic package according to one embodiment of the present invention. The results show a 33% reduction in loop inductance for the power delivery region, no change in the inductance in the I/O region, and only a 6% increase in inductance across the junction. Since the majority of current flows in the power delivery region the benefit seen by the 33% reduction will be much greater than the negative impact of the 6% increase across the junction. Therefore, the present invention maximizes power delivery and I/O performance in a microelectronic package.

Figure 8:
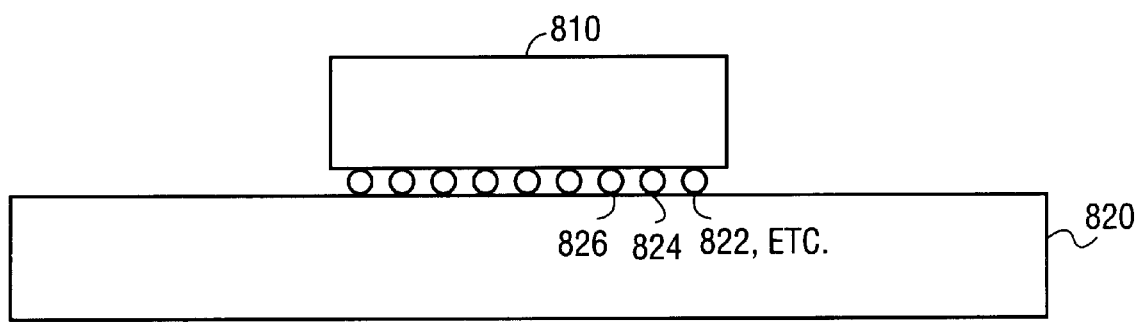
FIG. 8 is a schematic diagram of a microelectronic die mounted to a substrate in a microelectronic package.

Referring now to FIG. 8 there is shown a schematic diagram of a microelectronic die mounted to a microelectronic substrate in a microelectronic package. The microelectronic die 810 (in this case a flip chip) is secured to a substrate 820 and attached to it using an array of bond pads (not shown in this view) spaced on an active surface of the microelectronic die 810. An array of minute solder balls 822, 824, 826, etc., is disposed on the flip chip bond pads. The flip chip is then positioned (i.e., flipped) such that the solder balls 822, 824, 826, etc., are aligned with an array of bond pads (not shown in this view) on an active surface of the substrate 820. The substrate bond pads are essentially in mirror-image placement to the flip chip bond pads. It should be appreciated that various other types of electrical connections between the microelectronic die 810 and the substrate 820 may also be used. For example, the microelectronic die 810 may be mounted to the substrate 820 using Chip-on-Flex ("COF") packaging where a flex component (i.e., the substrate) is attached with an adhesive layer to an active surface of the microelectronic die 810.

The substrate 820 contains multiple conductive planes including a power region and an I/O region (not shown in this view) as is described herein. Correlated conductive planes on varying horizontal levels in the power region and I/O region may be stitched together in a manner also described herein. The substrate 820 may be electrically connected to a motherboard (not shown in this view) as is well known in the art of microelectronic packaging.

Thus, a stitched plane structure for optimal microelectronic package power delivery and dual referenced stripline I/O performance has been described. Although the foregoing description and accompanying figures discuss and illustrate specific embodiments, it should be appreciated that the present invention is to be measured only in terms of the claims that follow.

What is claimed is:

1. A microelectronic package, comprising:
   a die affixed to a substrate including a plurality of conductive planes; and
   a power plane to provide a first voltage on a first level in a power delivery region of the substrate electrically coupled to a power plane to provide the first voltage on a second level in a signal region of the substrate; and
   a power plane to provide a second voltage on the second level in the power delivery region of the substrate electrically coupled to a power plane to provide the second voltage on the first level in the signal region of the substrate.

2. The microelectronic package of claim 1 wherein the power delivery region of the substrate includes power planes to provide the first voltage alternated with power planes to provide the second voltage.

3. The microelectronic package of claim 1 wherein the signal region of the substrate includes a dual referenced stripline stackup including a metal trace sandwiched between the first level and the second level.

4. The microelectronic package of claim 1 wherein alternating tabs in the power plane to provide the first voltage on the first level in the power delivery region of the substrate are electrically connected to alternating tabs in the power plane to provide the first voltage on the second level of the signal region of the substrate, the alternating tabs stitched together with alternating vias.

5. The microelectronic package of claim 1 wherein alternating tabs in the power plane to provide the second voltage on the second level of the power delivery region of the substrate are electrically connected to alternating tabs in the power plane to provide the second voltage on the first level of the signal region of the substrate, the alternating tabs stitched together with alternating vias.

6. The microelectronic package of claim 1 wherein the first voltage is Vcc and the second voltage is Vss.

7. The microelectronic package of claim 1 wherein the first voltage is Vcc and the second voltage is ground.

8. A microelectronic package, comprising:
   a die affixed to a substrate including a plurality of conductive planes;
   a power delivery region of the substrate merging with a signal region of the substrate at a junction, the power delivery region having a first power plane at a first level and a second power plane at a second level and the signal region having a third power plane at the first level and the a fourth power plane at the second level; and
   alternating tabs in the power delivery region of the substrate stitched together at the junction with alternating tabs in the signal region of the substrate, the alternating tabs electrically connecting the first power plane to the fourth power plane and electrically connecting the second power plane to the third power plane.

9. The microelectronic package of claim 8 wherein the first and fourth power planes are voltage planes and the second and third power planes are ground planes.

10. The microelectronic package of claim 8 wherein the signal region of the substrate includes a dual referenced stripline stackup including a metal trace sandwiched between the third power plane and the fourth power plane.

11. The microelectronic package of claim 8 wherein the tabs in the power delivery region of the substrate and the tabs in the signal region of the substrate are stitched together using alternating vias.

12. The microelectronic package of claim 8 wherein the stitching maintains current flow both perpendicular and parallel to an edge of the substrate.

13. A multilayer microelectronic package substrate, comprising:
   a power plane on a first level in a power delivery region of the substrate electrically coupled to a power plane on a second level in a signal region of the substrate; and
   a ground plane on the second level in the power delivery region of the substrate electrically coupled to a ground plane on the first level in the signal region of the substrate.

14. The multilayer microelectronic package substrate of claim 13 wherein the power delivery region of the substrate includes alternating ground and power planes.

15. The multilayer microelectronic package substrate of claim 13 wherein the signal region of the substrate includes a dual referenced stripline stackup including a metal trace sandwiched between the ground plane on the first level and the power plane on the second level.

16. The multilayer microelectronic package substrate of claim 13 wherein alternating tabs in the ground plane in the power delivery region of the substrate are stitched together with alternating tabs in the ground plane in the signal region of the substrate.

17. The multilayer microelectronic package substrate of claim 13 wherein alternating tabs in the power delivery region of the substrate and alternating tabs in the signal region of the substrate are stitched together using alternating vias.

18. The multilayer microelectronic package substrate of claim 17 wherein the stitching maintains current flow both perpendicular and parallel to an edge of the substrate.

* * * * *